US012525938B2

(12) United States Patent
Song

(10) Patent No.: US 12,525,938 B2
(45) Date of Patent: Jan. 13, 2026

(54) CIRCUIT FOR REMOVING OFFSET OUTPUT VOLTAGE, AND ELECTRONIC DEVICE COMPRISING SAME

(71) Applicant: CHUNG ANG UNIVERSITY INDUSTRY ACADEMIC COOPERATION FOUNDATION, Seoul (KR)

(72) Inventor: Sang Hun Song, Seoul (KR)

(73) Assignee: CHUNG ANG UNIVERSITY INDUSTRY ACADEMIC COOPERATION FOUNDATION, Seoul (KR)

( * ) Notice: Subject to any disclaimer, the term of this patent is extended or adjusted under 35 U.S.C. 154(b) by 435 days.

(21) Appl. No.: 18/268,475

(22) PCT Filed: Nov. 16, 2021

(86) PCT No.: PCT/KR2021/016762
§ 371 (c)(1),
(2) Date: Jun. 20, 2023

(87) PCT Pub. No.: WO2022/169075
PCT Pub. Date: Aug. 11, 2022

(65) Prior Publication Data
US 2024/0039496 A1 Feb. 1, 2024

(30) Foreign Application Priority Data
Feb. 2, 2021 (KR) .................. 10-2021-0015023

(51) Int. Cl.
*H03F 3/45* (2006.01)
*H03F 1/30* (2006.01)

(52) U.S. Cl.
CPC ......... *H03F 3/45744* (2013.01); *H03F 1/306* (2013.01); *H03F 2200/261* (2013.01)

(58) Field of Classification Search
CPC ................ H03F 3/45744; H03F 1/306; H03F 2200/261; H03F 2200/375; H03F 3/187;
(Continued)

(56) References Cited

U.S. PATENT DOCUMENTS

| 4,709,320 | A | 11/1987 | Konopka |
| 8,736,369 | B2 | 5/2014 | Petrie |
| 11,949,427 | B2 * | 4/2024 | Mcveigh ............. H03M 1/0607 |

FOREIGN PATENT DOCUMENTS

| JP | 08-070223 A | 3/1996 |
| JP | 11-142256 A | 5/1999 |

(Continued)

*Primary Examiner* — Hieu P Nguyen
(74) *Attorney, Agent, or Firm* — Bridgeway IP Law Group, PLLC; Sang Ho Lee; Hyun Woo Shin

(57) ABSTRACT

According to the present disclosure, a circuit for cancelling an off-set voltage included in an output voltage of an electronic component includes: a first resistor having one end connected to a bias voltage terminal; a second resistor connected to the first resistor, and having one end connected to the bias voltage terminal; a third resistor having one end connected to the first resistor and the other end connected to a ground terminal; and a transistor having one end connected to the second resistor and the other end connected to the ground terminal, and applied with an output voltage including an off-set voltage from a sensor.

12 Claims, 8 Drawing Sheets

(58) Field of Classification Search
CPC .......... H03F 2200/372; G01R 33/0029; G01R 33/07
USPC ...................................................... 330/9, 51
See application file for complete search history.

(56) References Cited

FOREIGN PATENT DOCUMENTS

| | | |
|---|---|---|
| JP | 2008-267965 A | 11/2008 |
| JP | 5540882 B2 | 7/2014 |
| JP | 2020-159891 A | 10/2020 |
| KR | 10-1252331 B1 | 4/2013 |
| KR | 10-2015-0034692 A | 4/2015 |
| KR | 10-1739921 B1 | 5/2017 |
| KR | 10-1788876 B1 | 10/2017 |

\* cited by examiner

CIRCUIT FOR REMOVING OFFSET OUTPUT VOLTAGE, AND ELECTRONIC DEVICE COMPRISING SAME

BACKGROUND

Field

The present disclosure relates to a circuit for cancelling an off-set voltage included in an output voltage of an electronic component and an electronic device including the same.

Description of the Related Art

If an input signal is not generated in an electronic component of a linear structure, an output signal is preferably not also generated.

However, despite the absence of the input signal, DC voltages are often generated in an output terminal, and at this time, an unnecessarily generated output voltage is called off-set voltage.

In particular, the off-set voltage is generated frequently at the output terminals of various sensors, which need to be cancelled or minimized because the off-set voltage causes a lot of difficulties in the circuit after the output terminal.

In order to cancel the off-set voltage generated in the output terminal of the sensor, a circuit connected to an input terminal is mainly changed in the related art, but in the present disclosure, a simple circuit for cancelling the off-set voltage is applied to the output terminal without changing the circuit connected to the input terminal of the sensor.

There is Korean Registered Patent No. 10-1252331 (Apr. 8, 2013) as related prior art.

DETAILED DESCRIPTION OF THE INVENTION

Summary

An object of an exemplary embodiment of the present disclosure is to provide a circuit for cancelling an off-set voltage included in an output voltage of an electronic component by connecting a circuit constituted by multiple resistors including a variable resistor and transistors to an output terminal of the electronic component.

Moreover, an object of an exemplary embodiment of the present disclosure is to provide an amplification function of a signal as the output voltage of the circuit is amplified by the transistor after the off-set voltage is cancelled.

The objects to be solved by the present disclosure are not limited to the aforementioned object(s), and other object(s), which are not mentioned above, will be apparent to a person having ordinary skill in the art from the following description.

In order to achieve the objects, according to an aspect of the present disclosure, a circuit for cancelling an off-set voltage included in an output voltage of a sensor may include: a first resistor having one end connected to a bias voltage terminal; a second resistor connected to the first resistor, and having one end connected to the bias voltage terminal; a third resistor having one end connected to the first resistor and the other end connected to a ground terminal; and a transistor having one end connected to the second resistor and the other end connected to the ground terminal, and applied with an output voltage including an off-set voltage from the sensor.

Technical Solution

In one exemplary embodiment, a first output terminal may be connected between the first resistor and the third resistor, a second output terminal may be connected between the second resistor and the transistor, and an output voltage difference between the first output terminal and the second output terminal may be 0.

In one exemplary embodiment, as a resistance value of the third resistor is varied, the output voltage difference between the first output terminal and the second output terminal may be controlled to 0.

In one exemplary embodiment, the output voltage difference between the first output terminal and the second output terminal may be enabled to be expressed as an Equation regarding a voltage value of the bias voltage terminal, respective resistance values of the first to third resistors, and a channel resistance value of the transistor.

In one exemplary embodiment, the equation may be $$V_A - V_B = V_{CC} \cdot \left( \frac{R_3}{R_1 + R_3} - \frac{R_{JFET,B=0T}}{R_{JFET,B=0T} + R_2} \right).$$

In one exemplary embodiment, the transistor may be a junction gate field effect transistor (JFET).

In order to achieve the objects, according to another aspect of the present disclosure, an electronic device may include a circuit, and the circuit may include a first resistor having one end connected to a bias voltage terminal; a second resistor connected to the first resistor in series, and having one end connected to the bias voltage terminal; a third resistor having one end connected to the first resistor and the other end connected to a ground terminal; and a transistor having one end connected to the second resistor and the other end connected to the ground terminal, and applied with an output voltage including an off-set voltage from a hall sensor.

In one exemplary embodiment, a first output terminal may be connected between the first resistor and the third resistor, a second output terminal may be connected between the second resistor and the transistor, and an output voltage difference between the first output terminal and the second output terminal may be 0.

In one exemplary embodiment, as a resistance value of the third resistor is varied, the output voltage difference between the first output terminal and the second output terminal may be controlled to 0.

In one exemplary embodiment, the output voltage difference between the first output terminal and the second output terminal may be enabled to be expressed as an Equation regarding a voltage value of the bias voltage terminal, respective resistance values of the first to third resistors, and a channel resistance value of the transistor.

In one exemplary embodiment, the equation may be $$V_A - V_B = V_{CC} \cdot \left( \frac{R_3}{R_1 + R_3} - \frac{R_{JFET,B=0T}}{R_{JFET,B=0T} + R_2} \right).$$

In one exemplary embodiment, the transistor may be a junction gate field-effect transistor (JFET).

According to an exemplary embodiment of the present disclosure, it is possible to cancel an off-set voltage included in an output voltage of a sensor by connecting a circuit constituted by multiple resistors including a variable resistor and transistors to an output terminal of an electronic component.

Further, according to an exemplary embodiment of the present disclosure, it is possible to provide an amplification function of a signal as the output voltage of the circuit is amplified by the transistor after the off-set voltage is cancelled.

The effects of the present disclosure are not limited to the aforementioned effect, and other effects, which are not mentioned above, will be apparent to a person having ordinary skill in the art from the following disclosure.

BRIEF DESCRIPTION OF THE DRAWINGS

The above and other aspects, features and other advantages of the present disclosure will be more clearly understood from the following detailed description taken in conjunction with the accompanying drawings, in which.

EXPLANATION OF KEY REFERENCE NUMERALS IN THE DRAWINGS

Figure 1A:
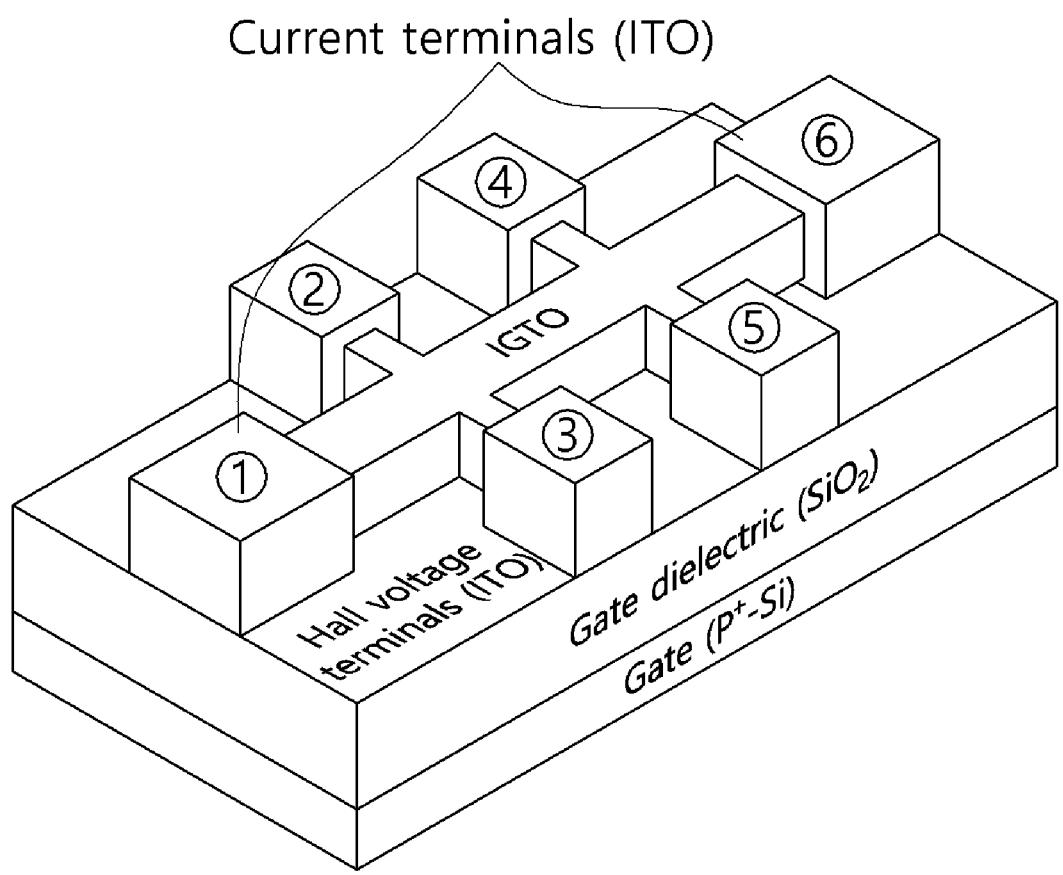
FIG. 1A is a diagram illustrating a sensor as a schematic image according to an exemplary embodiment of the present disclosure.

100: Sensor
$R_1$: first resistor, resistance value of first resistor
$R_2$: second resistor, resistance value of second resistor
$R_3$: third resistor, resistance value of third resistor
Vcc: bias voltage terminal, bias voltage value
JFET: transistor
R_JFET: channel resistance of the transistor converted according to gate voltage
A: first output terminal
B: second output terminal

DETAILED DESCRIPTION OF THE EMBODIMENT

The present disclosure may have various modifications and various exemplary embodiments and specific exemplary embodiments will be illustrated in the drawings and described in detail in the detailed description. However, this does not limit the present disclosure to specific exemplary embodiments, and it should be understood that the present disclosure covers all the modifications, equivalents and replacements included within the idea and technical scope of the present disclosure. In describing each drawing, like reference numerals refer to like elements.

It should be understood that, when it is described that a component is "connected to" or "accesses" another component, the component may be directly connected to or access the other component or a third component may be present therebetween. In contrast, when it is described that a component is "directly connected to" or "directly accesses" another component, it is understood that no element is present between the element and another element.

Terms used in the present application are used only to describe specific embodiments, and are not intended to limit the present disclosure. A singular form may include a plural form if there is no clearly opposite meaning in the context. In the present application, it should be understood that term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

If it is not contrarily defined, all terms used herein including technological or scientific terms have the same meanings as those generally understood by a person with ordinary skill in the art. Terms which are defined in a generally used dictionary should be interpreted to have the same meaning as the meaning in the context of the related art, and are not interpreted as an ideal meaning or excessively formal meanings unless clearly defined in the present application.

Hereinafter, a preferred exemplary embodiment of the present disclosure will be described in detail with reference to the accompanying drawings.

Figure 1B:
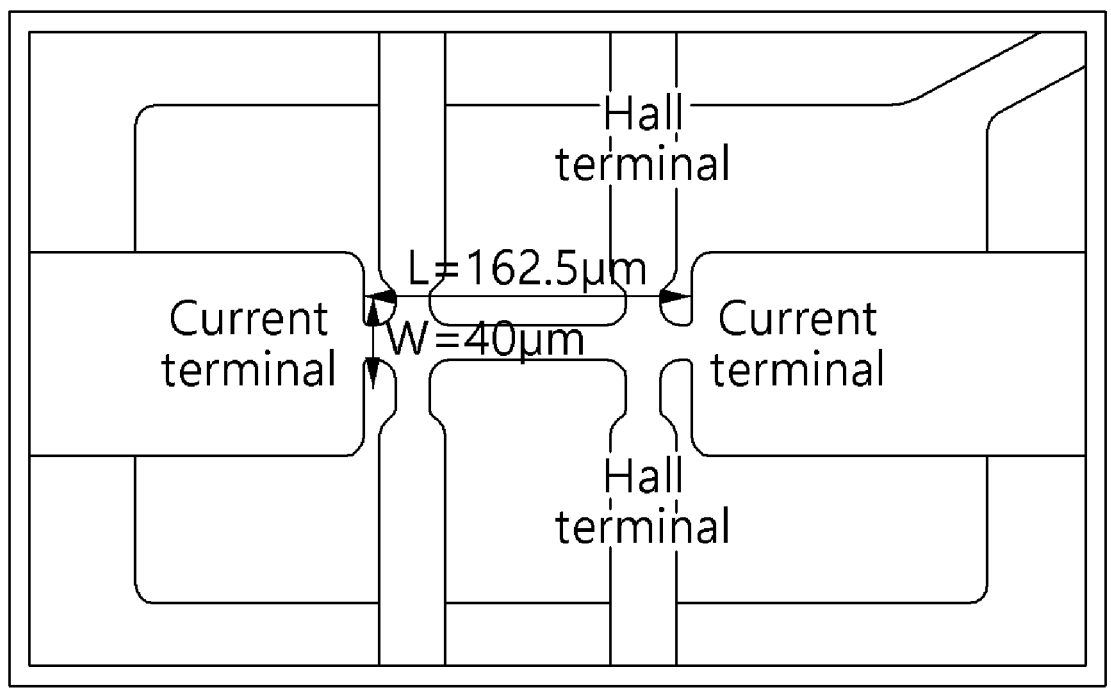
FIG. 1B is a diagram illustrating, as an optical image, the sensor according to an exemplary embodiment of the present disclosure.

FIG. 1A is a diagram illustrating a sensor as a schematic image according to an exemplary embodiment of the present disclosure and FIG. 1B is a diagram illustrating, as an optical image, the sensor according to an exemplary embodiment of the present disclosure.

Prior to the description, the present disclosure relates to a circuit connected to an output terminal of an electronic device having an electronic component, and particularly, a circuit for cancelling an off-set voltage included in an output voltage of a sensor among electronic components, and may apply the circuit to the output terminal of the sensor. Hereinafter, for convenience of the description, the circuit of the present disclosure will be described based on the sensor.

The sensor may be implemented as a hall sensor. The hall sensor is a sensor that measures a direction and a size of a magnetic field by using a hall effect in which a voltage is generated in a vertical direction to a current and the magnetic field when the magnetic field is applied to a conductor in which the current flows. When the sensor is used, an unintended off-set voltage may be generated due to poor alignment of a hall probe, and in the present disclosure, a circuit for cancelling the off-set voltage at an output terminal other than an input terminal of the hall sensor is implemented. Meanwhile, the sensor of the present disclosure is not limited to the hall sensor, and is applicable to various types of sensors, but hereinafter, the sensor of the present disclosure will be referred to as the hall sensor for convenience of the description.

Referring to FIG. 1A, the hall sensor according to an exemplary embodiment of the present disclosure may be manufactured on an $SiO_2$ substrate having thermal conductivity doped on a p-type Si substrate.

Specifically, the hall sensor may be manufactured by sputtering a thin thin-film layer of an IGTO material and an ITO material on an $Si/SiO_2$ substrate. IGTO, an amorphous material, may provide a high conductive path to an electronic carrier due to the large spatial overlap of SN4+ cation and IN3+ cation, and has an advantage of applying the IGTO to a flexible electronic device due to a low temperature process.

As an exemplary embodiment, the hall sensor may include an ITO thin-film layer having a predetermined pattern. For example, the hall sensor may include an ITO thin-film layer used as two current terminals and an ITO thin-film layer used as four voltage terminals, and respective terminals may have a vertical structure to each other.

In this case, the IGTO thin-film layer may be used as a channel for connecting the ITO thin-film layer having the pattern, and as illustrated in FIG. 1B, a width W of the channel may be µm and a length L of the channel may be 162.5 µm, but there is no limit in terms of a numerical value.

Figure 2:
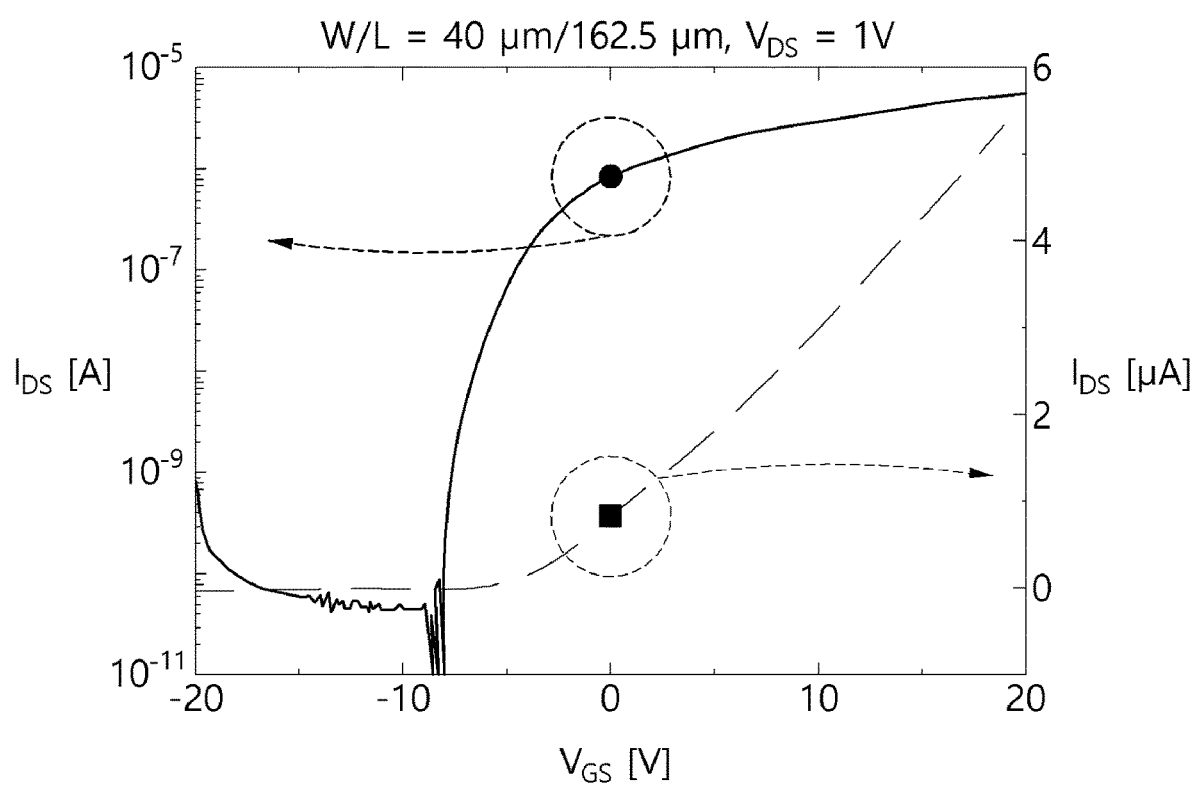
FIG. 2 is a graph illustrating a transmission feature of the sensor measured at a drain voltage in an exemplary embodiment of the present disclosure.

FIG. 2 is a graph illustrating a transmission feature of the sensor measured at a drain voltage in an exemplary embodiment of the present disclosure.

Referring to FIG. 2, $I_D$, $V_{GS}$, and $V_{DS}$ represent a drain current, a gate source voltage, and a drain source voltage, respectively. A threshold voltage $V_{TH}$, a field effect mobility $\mu_{FE}$, and a lower threshold value swing SS may have values of −3.01 V, 31.6 $cm^2 \cdot V^{-1} \cdot s^{-1}$, and 0.4 V·$decade^{-1}$, respectively.

Figure 3A:
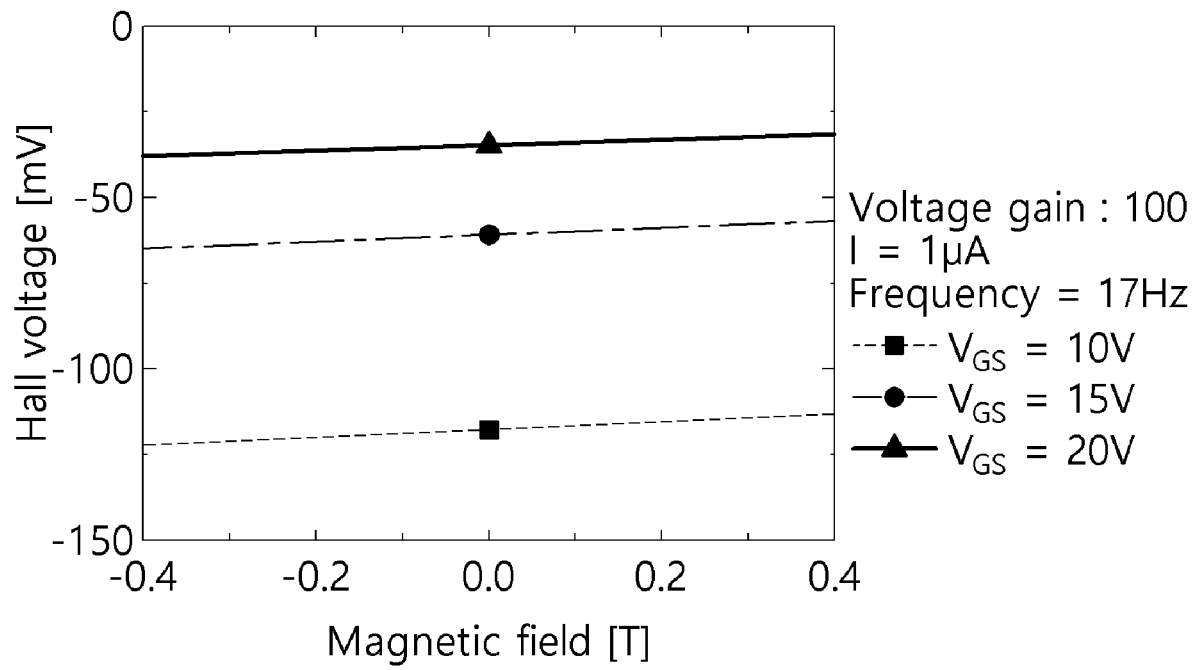
FIG. 3A is a graph illustrating a voltage measured by the sensor in an exemplary embodiment of the present disclosure.
Figure 3B:
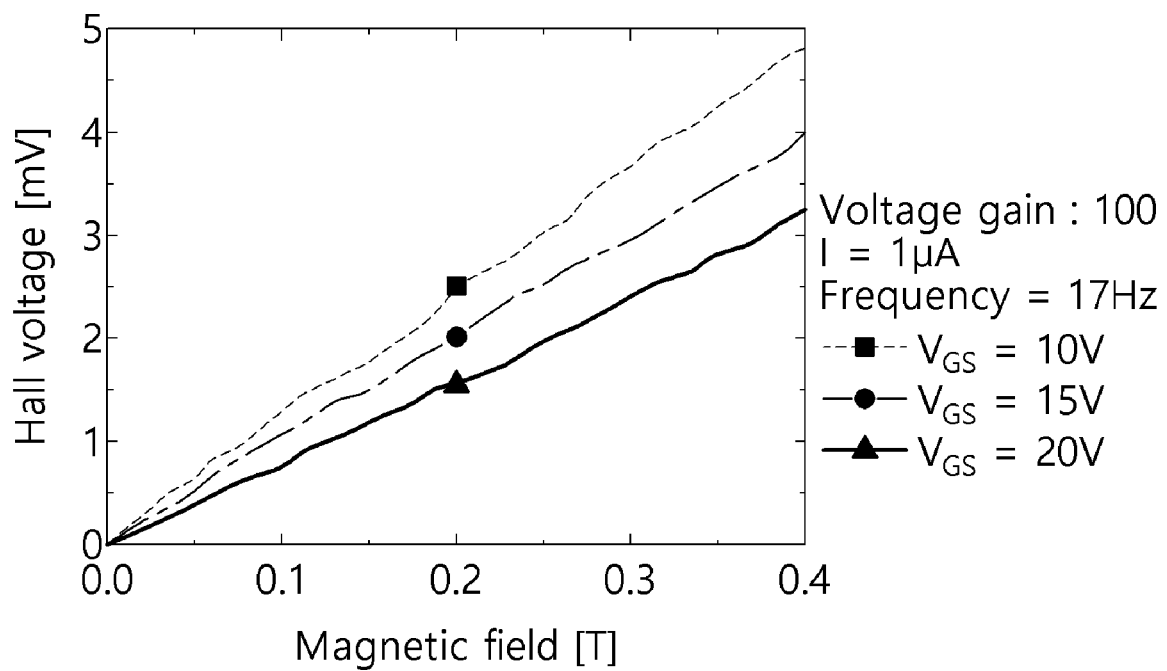
FIG. 3B is a graph illustrating an off-set correction result by an inverse magnetic field for the voltage of FIG. 3A.

FIG. 3A is a graph illustrating a hall voltage measured by the hall sensor in an exemplary embodiment of the present disclosure and FIG. 3B is a graph illustrating an off-set correction result by an inverse magnetic field for the hall voltage of FIG. 3A.

Referring to FIG. 3A, a hall voltage measured in a magnetic field intensity range of −0.4 to 0.4 T with respect to $V_{GS}$ which is the gate source voltage is illustrated, and an AC current of 1 µA flows at 17 Hz between two current terminals, and the magnetic field is vertically applied to the hall sensor, and the hall voltage is measured through a hall probe.

According to a basic hall theory, if the magnetic field is zero, the hall voltage is also 0, but as illustrated in FIG. 3A, it may be judged that there is the off-set voltage when the hall voltage is measured as a non-zero value. The off-set voltage may complicate the analysis of the sensor measurement result and cause an inaccurate result.

Meanwhile, a sensitivity S which is one of important features of the hall sensor may be defined as in Equation 1 below.

$$S = \left| \frac{V_{HALL}}{B_\perp} \right| \quad \text{[Equation 1]}$$

Where $V_{HALL}$ represents the hall voltage and $B_\perp$ represents the magnetic field vertically applied to the hall sensor. The hall sensor is an element in which the hall voltage varies according to the intensity of the magnetic field, and if the hall voltage is known, the intensity of the magnetic field may be known, and on the contrary, if the intensity of the magnetic field is known, the hall voltage may be known. However, if the off-set voltage is included in the hall voltage, it is difficult to accurately know the intensity of the magnetic field.

Therefore, a component of the off-set voltage needs to be corrected in order to obtain a measurement value of the hall sensor. In the off-set correction, the hall voltage which linearly depends on the magnetic field may be obtained without the off-set voltage except for a voltage value measured by a magnetic field acting in an opposite direction, and a result thereof is illustrated in FIG. 3B.

For reference, features of electrical medium variable values such as a sheet electron density $n_{Sheet}$ and a hall mobility $\mu_{Hall}$ for different gate source voltages may be represented as in [Table 1] below through a correction equation $V_{Hall} = \frac{1}{2}[V^*(+B) - V^*(-B)]$.

TABLE 1

| Vgs | 10 V | 15 V | 20 V |
|---|---|---|---|
| $n_{Sheet}$ [$cm^{-2}$] | $5.19 \times 10^{12}$ | $6.27 \times 10^{12}$ | $7.69 \times 10^{12}$ |
| $\mu_{Hall}$ [$cm^2/V \cdot s$] | 34.9. | 38.2. | 40.4. |

However, such an off-set correction process should be performed after voltage measurement is completed, and it is difficult to confirm whether the off-set voltage is generated in real time. Therefore, in the present disclosure, in order to more easily and efficiently cancel the off-set voltage, a simple circuit constituted by the resistor and the transistor is applied to the output terminal of the hall sensor.

Figure 4A:
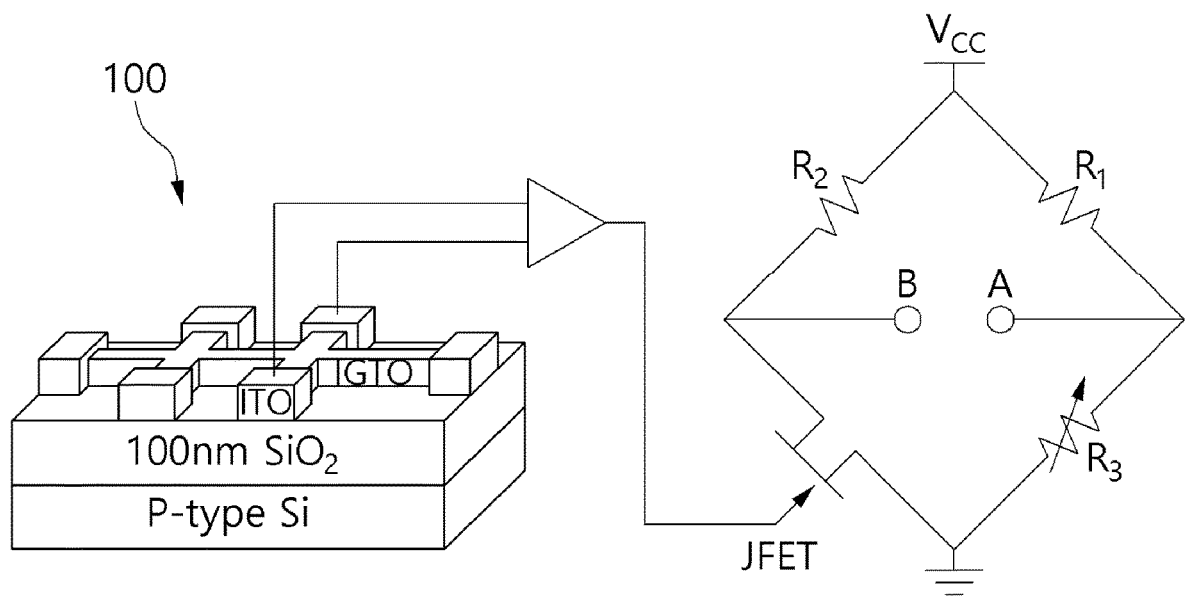
FIG. 4A is a diagram illustrating a circuit for cancelling an off-set output voltage according to an exemplary embodiment of the present disclosure.
Figure 4B:
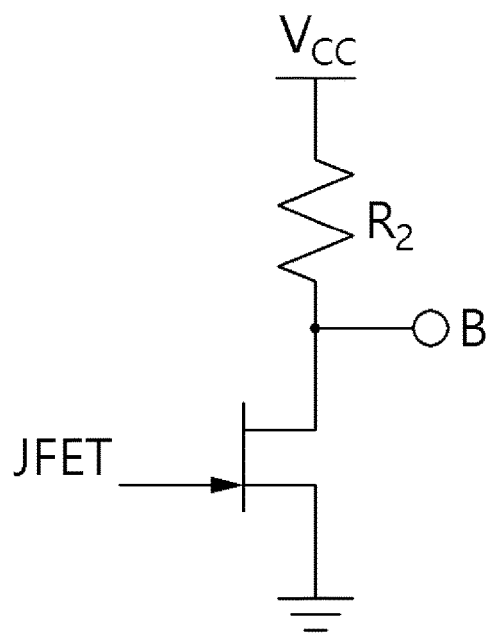
FIG. 4B is a diagram illustrating a right terminal of a circuit used as a signal amplifier in an exemplary embodiment of the present disclosure.

FIG. 4A is a diagram illustrating a circuit for cancelling an off-set voltage according to an exemplary embodiment of the present disclosure and FIG. 4B is a diagram illustrating a right terminal of a circuit used as a signal amplifier in an exemplary embodiment of the present disclosure.

Referring to FIG. 4A, the circuit for cancelling the off-set output voltage according to an exemplary embodiment of the present disclosure may be configured to include three resistors constituted by two fixation resistors $R_1$ and $R_2$ and one variable resistor $R_3$, and one transistor JFET.

As an exemplary embodiment, one end of a first resistor $R_1$ which is one of the fixation resistors may be connected to a bias voltage terminal, and a second resistor $R_2$ which is the other one of the fixation resistors may be connected to the first resistor $R_1$, and in this case, one end may be connected to the bias voltage terminal Vcc. For reference, in the exemplary embodiment, 10 kΩ and 500Ω may be applied to the first resistor $R_1$ and the second resistor $R_2$, respectively.

As an exemplary embodiment, one end of the third resistor $R_3$ which is the variable resistor may be connected to the first resistor $R_1$ and the other end may be connected to a ground terminal. As a result, the other end of the first resistor $R_1$ may be connected to one end of the third resistor $R_3$.

As an exemplary embodiment, the transistor JFET is an element to which the output voltage including the off-set voltage is applied from the hall sensor 100, and one end may be connected to the second resistor $R_2$ and the other end may be connected to the ground terminal. As a result, the other end of the second resistor $R_2$ may be connected to one end of the transistor JFET.

For reference, 12 V may be applied as the bias voltage value Vcc supplied to the circuit.

The transistor JFET as an element for converting the output voltage applied from the hall sensor 100 into a resistance may be referred to as a voltage-controlled resistor. In this case, the transistor JFET is usable as all transistors serving as a voltage amplification element in addition to a general voltage-controlled element. In the exemplary embodiment, the transistor JFET may adopt a junction gate field effect transistor (JFET), but in some cases, also adopt a metal oxide semiconductor field effect transistor (MOSFET) or other types of field effect transistors (FETs).

As an exemplary embodiment, a first output terminal A may be connected between the first resistor $R_1$ and the third resistor $R_3$, and a second output terminal B may be connected between the second resistor $R_2$ and the transistor.

In this case, an output voltage difference between the first output terminal A and the second output terminal B is preferably 0. This means that when the voltage difference applied between two output terminals is 0, the off-set voltage applied to the circuit through the transistor JFET is cancelled. In order to control the output voltage difference to 0, a resistance value of the third resistor $R_3$ which is the variable resistor may be varied.

The circuit of the present disclosure has such a structure to be implemented as a bridge circuit, and specifically, driven as a Wheatstone bridge circuit.

A process of cancelling the off-set voltage according to the control of the resistance value of the third resistor $R_3$ will be described below in detail.

First, the output voltage of the hall sensor 100 may be applied to the transistor JFET and adopted as gate voltage of the transistor JFET. Thereafter, the transistor JFET may convert the gate voltage into the resistance and have a resistance value corresponding to $R_{JFET,B=0T}$. Here, $R_{JFET,B=0T}$ means a channel resistance of the transistor JFET when the magnetic field is 0. Thereafter, the output voltage values of the first output terminal A and the second output terminal B may be defined as in Equations 2 to 4 below by the above-described circuit structure.

$$V_A = V_{CC} \cdot \frac{R_3}{R_1 + R_3}$$ [Equation 2]

$$V_B = V_{CC} \cdot \frac{R_{JFET,B=0T}}{R_{JFET,B=0T} + R_2}$$ [Equation 3]

$$V_A - V_B = V_{CC} \cdot \left( \frac{R_3}{R_1 + R_3} - \frac{R_{JFET,B=0T}}{R_{JFET,B=0T} + R_2} \right)$$ [Equation 4]

Where $V_A$ represents the output voltage value of the first output terminal A, $V_B$ represents the output voltage value of the second output terminal B, Vcc represents a voltage value of the bias voltage terminal, $R_1$ represents the resistance value of the first resistor, $R_2$ represents the resistance value of the second resistor, $R_3$ represents the resistance value of the third resistor, and $R_{JFET,B=0T}$ represents a channel resistance value of the transistor JFET when the magnetic field is 0.

In this case, the resistance value of the third resistor $R_3$ is controlled to set the output voltage difference between the first output terminal A and the second output terminal B to 0. In other words, when a voltage applied to each output terminal is controlled as a resistance ratio with the fixation resistance is set differently by controlling the resistance value of the third resistor $R_3$, the voltage difference of the output terminal may be set to 0.

Moreover, an off-set induction voltage caused according to the resistance value of the transistor JFET by the off-set voltage may be stored in any one of the first output terminal A or the second output terminal B. In the exemplary embodiment, the voltage stored in the second output terminal B may be the off-set induction voltage, and when the output voltage difference between the first output terminal A and the second output terminal B is 0, the off-set induction voltage stored in the second output terminal B may be stored in the first output terminal A.

After the off-set voltage is cancelled through the process, the transistor JFET may be used as a common source amplifier that amplifies the signal of the circuit. As a result, as illustrated in FIG. 4B, the output voltage of the second output terminal B connected to the transistor JFET may be amplified and output.

In other words, when the output voltage difference between the first output terminal A and the second output terminal B becomes 0 and the off-set voltage is cancelled, and then the magnetic field is applied, the transistor JFET performs a function of the common source amplifier.

Figure 5:
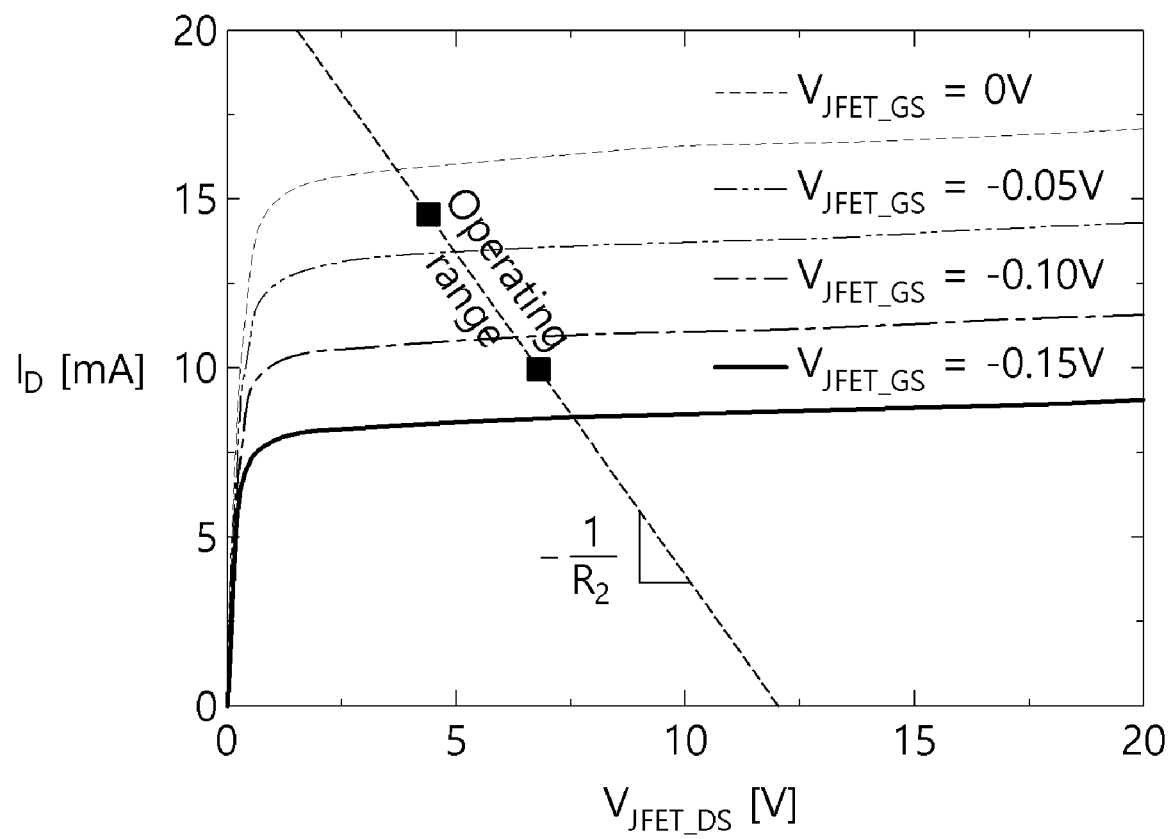
FIG. 5 is a graph illustrating an output feature for a gate source voltage of a transistor in an exemplary embodiment of the present disclosure.

FIG. 5 is a graph illustrating an output feature for a gate source voltage of a transistor in an exemplary embodiment of the present disclosure.

Referring to FIG. 5, an output feature for a case where the gate source voltage $V_{JFET\_GS}$ of the transistor is −0.15 V to 0 V when a hall voltage of −0.03 V to −0.12 V is applied to the transistor is illustrated. It may be confirmed that an operating range of the transistor is in a saturation region, and has a constant transconductance value of 0.0528 A·V$^{-1}$.

Figure 6:
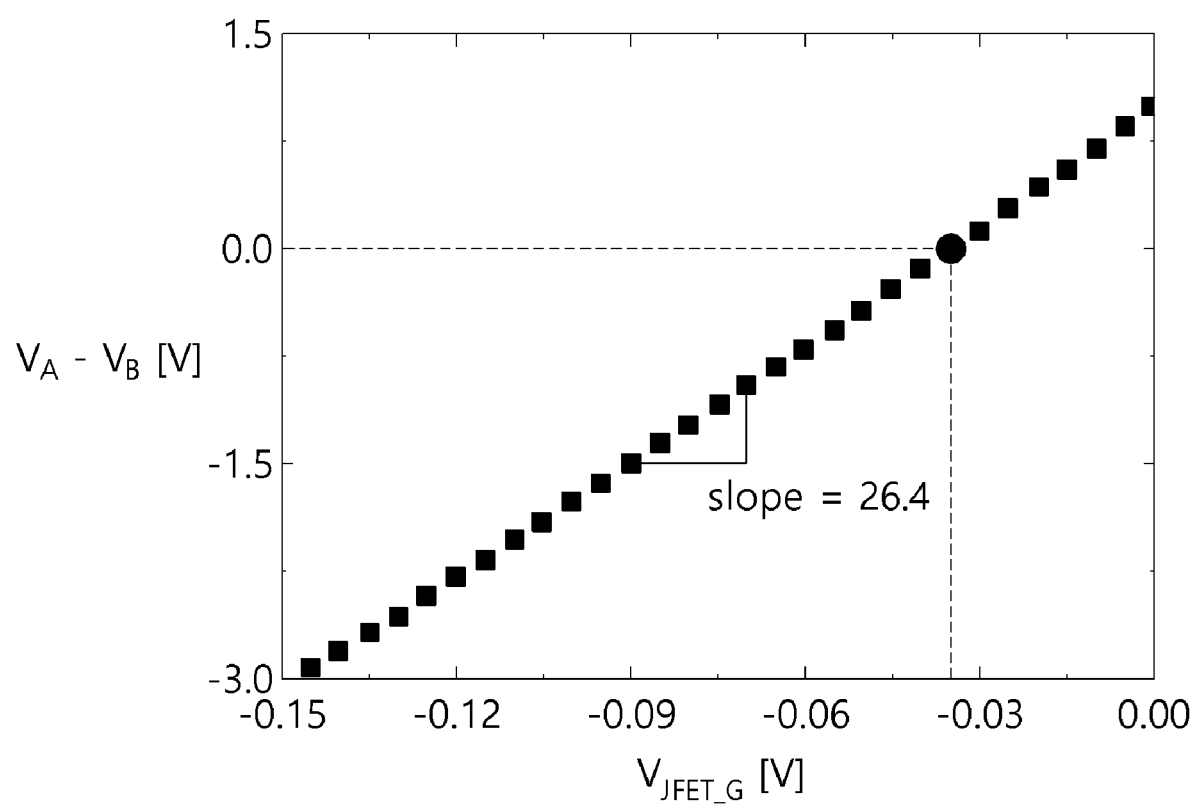
FIG. 6 is a graph illustrating an output voltage feature of an output terminal depending on adjustment of a resistance value of a third resistor and a gate source voltage of the transistor in an exemplary embodiment of the present disclosure.

FIG. 6 is a graph illustrating an output voltage feature of an output terminal depending on adjustment of a resistance value of a third resistor and a gate source voltage of the transistor in an exemplary embodiment of the present disclosure.

Referring to FIG. 6, it may be seen that as the gate source voltage V JFET GS of the transistor fluctuates, the output voltage of the output terminal has a linearity. In the exemplary embodiment, it may be confirmed that the voltage difference of the output terminals is 0 as a result of setting the gate source voltage of the transistor to −0.035 V and adjusting the resistance value of the third resistor to 5.7 kΩ. In other words, an output signal between the first output terminal A and the second output terminal B is set to 0. Through this, it may be seen that the off-set voltage is cancelled.

Here, the gate source voltage of the transistor may be an off-set voltage when the output voltage of −0.035 V is applied to the transistor from the hall sensor.

Moreover, a gain of an output voltage slope of the output terminal depending on the fluctuation of the gate source voltage of the transistor may be 26.4.

Meanwhile, the output signal between the first output terminal A and the second output terminal B may be defined as in Equation 5.

$$V_A - V_B = -g_{m1} V_{offset} R_2 + g_{m2} V_{measured\ Hall} R_2$$ [Equation 5]

Where $g_{m1}$ and $g_{m2}$ represent the transconductances of the transistor JFET, $V_{off-set}$ represents the off-set voltage of the hall sensor when the magnetic field is 0, $V_{measured\ Hall}$ represents the hall voltage of the hall sensor when the magnetic field is applied, and $R_2$ represents the second resistance value.

When the transconductance of each transistor JFET is constantly maintained within the operating range ($g_{m1} \approx g_{m2} \approx g_m$) Equation 5 may be summarized as in Equation 6.

$$V_A - V_B = (V_{measured\ Hall} - V_{offset}) g_m R_2 \qquad \text{[Equation 6]}$$

In this case, since $V_{measured\ Hall}$ includes the off-set voltage, $V_{measured\ Hall}$ may be defined as $V_{measured\ Hall} = V_{-Hall} + V_{off\text{-}set\text{-}}$. As a result, the output signal between the first output terminal A and the second output terminal B may be finally represented as in Equation 7.

$$V_A - V_B = g_m V_{Hall} R_2 \qquad \text{[Equation 7]}$$

Accordingly, the output signal between the first output terminal A and the second output terminal B may be directly proportional to the hall voltage in which the off-set is cancelled.

Figure 7:
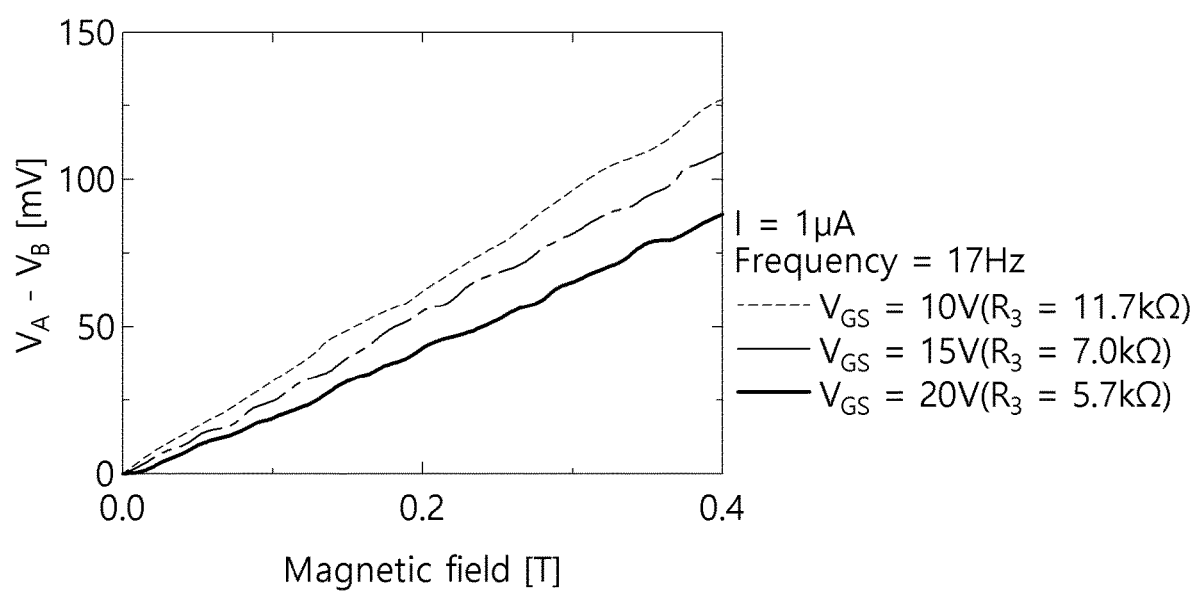
FIG. 7 is a graph illustrating the output voltage feature of the output terminal from which the off-set voltage depending on an intensity of a magnetic field is cancelled in an exemplary embodiment of the present disclosure.

FIG. 7 is a graph illustrating the output voltage feature of the output terminal from which the off-set voltage depending on an intensity of a magnetic field is cancelled in an exemplary embodiment of the present disclosure.

Referring to FIG. 7, it may be seen that when the intensity of the magnetic field is set to 0 T, as the transistor operates as the voltage controlled resistor, the output voltage difference of the output terminals becomes 0, so the off-set voltage is cancelled, and it may be seen that when the intensity of the magnetic field is set to 0.4 T, as the transistor operates as the amplifier, the output voltage difference of the output terminals is amplified.

In this case, it may be confirmed that the output voltage of the output terminal is amplified more 26.4 times in the case of cancelling the off-set voltage by using the circuit of the present disclosure than the correction result of the off-set voltage of FIG. 3B.

Accordingly, according to an exemplary embodiment of the present disclosure, it is possible to cancel an off-set voltage included in an output voltage of a sensor by connecting a circuit constituted by multiple resistors including a variable resistor and transistors to an output terminal of the sensor.

Further, according to an exemplary embodiment of the present disclosure, it is possible to provide an amplification function of a signal as the output voltage of the circuit is amplified by the transistor after the off-set voltage is cancelled.

The above description just illustrates the technical spirit of the present disclosure and various changes and modifications can be made by those skilled in the art to which the present disclosure pertains without departing from an essential characteristic of the present disclosure. Therefore, the exemplary embodiments of the present disclosure are provided for illustrative purposes only but not intended to limit the technical concept of the present disclosure. The scope of the technical concept of the present disclosure is not limited to the exemplary embodiment. The protective scope of the present disclosure should be construed based on the following claims, and all the technical concepts in the equivalent scope thereof should be construed as falling within the scope of the present disclosure.

What is claimed is:

1. A circuit for cancelling an off-set voltage included in an output voltage of an electronic component, the circuit comprising:
   a first resistor having one end connected to a bias voltage terminal;
   a second resistor connected to the first resistor, and having one end connected to the bias voltage terminal;
   a third resistor having one end connected to the first resistor and the other end connected to a ground terminal; and
   a transistor having one end connected to the second resistor and the other end connected to the ground terminal, and applied with an output voltage including the off-set voltage from a sensor.

2. The circuit for cancelling an off-set output voltage according to claim 1, wherein a first output terminal is connected between the first resistor and the third resistor,
   a second output terminal is connected between the second resistor and the transistor, and
   an output voltage difference between the first output terminal and the second output terminal is 0.

3. The circuit for cancelling an off-set output voltage according to claim 2, wherein as a resistance value of the third resistor is varied, the output voltage difference between the first output terminal and the second output terminal is controlled to 0.

4. The circuit for cancelling an off-set output voltage according to claim 3, wherein the output voltage difference between the first output terminal and the second output terminal is enabled to be expressed as an Equation regarding a voltage value of the bias voltage terminal, respective resistance values of the first to third resistors, and a channel resistance value of the transistor.

5. The circuit for cancelling an off-set output voltage according to claim 4, wherein the equation is $$V_A - V_B = V_{CC} \cdot \left( \frac{R_3}{R_1 + R_3} - \frac{R_{JFET, B=0T}}{R_{JFET, B=0T} + R_2} \right),$$

where $V_A$ represents an output voltage value of the first output terminal, $V_B$ represents the output voltage value of the second output terminal, $V_{CC}$ represent the voltage value of the bias voltage terminal, $R_1$, $R_2$, and $R_3$ represent the resistance values of the first to third resistors, respectively, and $R_{JFET}$ represents the channel resistance value of the transistor.

6. The circuit for cancelling an off-set output voltage according to claim 5, wherein the transistor is a junction gate field effect transistor (JFET).

7. An electronic device comprising a circuit for cancelling an off-set voltage included in an output voltage of a hall sensor,
   wherein the circuit includes
   a first resistor having one end connected to a bias voltage terminal;
   a second resistor connected to the first resistor in series, and having one end connected to the bias voltage terminal;
   a third resistor having one end connected to the first resistor and the other end connected to a ground terminal; and
   a transistor having one end connected to the second resistor and the other end connected to the ground terminal, and applied with an output voltage including the off-set voltage from the hall sensor.

8. The electronic device according to claim 7, wherein a first output terminal is connected between the first resistor and the third resistor,
   a second output terminal is connected between the second resistor and the transistor,
   an output voltage difference between the first output terminal and the second output terminal is 0.

9. The electronic device according to claim 8, wherein as a resistance value of the third resistor is varied, the output voltage difference between the first output terminal and the second output terminal is controlled to 0.

10. The electronic device according to claim 9, wherein the output voltage difference between the first output terminal and the second output terminal is enabled to be expressed as an Equation regarding a voltage value of the bias voltage terminal, respective resistance values of the first to third resistors, and a channel resistance value of the transistor.

11. The electronic device according to claim 10, wherein the equation is $$V_A - V_B = V_{CC} \cdot \left( \frac{R_3}{R_1 + R_3} - \frac{R_{JFET,B=0T}}{R_{JFET,B=0T} + R_2} \right),$$

where $V_A$ represents an output voltage value of the first output terminal, $V_B$ represents the output voltage value of the second output terminal, $V_{CC}$ represent the voltage value of the bias voltage terminal, $R_1$, $R_2$, and $R_3$ represent the resistance values of the first to third resistors, respectively, and $R_{JFET}$ represents the channel resistance value of the transistor.

12. The electronic device according to claim 9, wherein the transistor is a junction gate field-effect transistor (JFET).

* * * * *